United States Patent [19]

Jewell et al.

[11] Patent Number: 5,206,872
[45] Date of Patent: Apr. 27, 1993

[54] SURFACE EMITTING LASER

[75] Inventors: Jack L. Jewell, Bridgewater; Axel Scherer, Matawan, both of N.J.

[73] Assignee: AT&T Bell Laboratories, Murray Hill, N.J.

[21] Appl. No.: 786,653

[22] Filed: Nov. 1, 1991

[51] Int. Cl.[5] .................................................. H01S 3/19
[52] U.S. Cl. ........................................ 372/46; 372/50; 372/92
[58] Field of Search ..................... 372/45, 46, 50, 92, 372/108

[56] References Cited

U.S. PATENT DOCUMENTS 4,991,179 2/1991 Deppe et al. ........................... 372/45
4,999,842 3/1991 Huang et al. ........................... 372/45

OTHER PUBLICATIONS

J. L. Jewell et al, "Surface-emitting microlasers for photonic switching and interchip connections", *Optical Engineering*, vol. 29, No. 3 (Mar. 1990).
Y. J. Yang et al, "Low-threshold operation of a GaAs single quantum well mushroom structure surface-emitting laser", *App. Phys. Lett.*, 58 (16), pp. 1780-1782 (Apr. 1991).
C. R. Abernathy et al, "Ultrahigh doping of GaAs by carbon during metalorganic molecular beam epitaxy", *App. Phys. Lett.*, 55 (17), pp. 1750-1752 (Oct. 1989).
P. L. Gourley and T. J. Drummond, "Single crystal, epitaxial multilayers of Al As, GaAs, and $Al_xGa_{1-x}As$ for use as optical interferometric elements", Appl. Phys. Lett. 49(9), pp. 489-491 (Sep. 1986).
Y. Arakawa and A. Yariv, "Theory of Gain, Modulation Response, and Spectral Linewidth in AlGaAs Quantum Well Lasers", IEEE Journal of Quantum Electronics, vol. QE-21, No. 10, pp. 1666-1674 (Oct. 1985).

Primary Examiner—James W. Davie
Attorney, Agent, or Firm—G. S. Indig

[57] ABSTRACT

Reduction of laser threshold in an electrically pumped vertical cavity laser is the consequence of interpositioning of an electrode layer intermediate the active, photon producing region, and at least one of the two Distributed Bragg Reflectors defining the laser cavity. The advance is a consequence of the lowered pump circuit resistance due to elimination of one or both DBRs—in particular, to elimination of the p-doped DBR—from the pump circuit.

23 Claims, 3 Drawing Sheets

STANDING WAVE INTENSITY

SURFACE EMITTING LASER

BACKGROUND OF THE INVENTION

1. Technical Field

The invention relates to a category of lasers including vertical cavity lasers, of design known as surface emitting lasers. Most important, such devices appear to satisfy the desire for integratable lasers—lasers to serve in Opto Electronic Integrated Circuits as well as in all-optic circuits. Contemplated integrated circuits may include electronics—generally semiconductor electronics—serving both for operation of the lasers and for other purposes.

2. Description of the Prior Art

Virtually from inception, the emergence of the laser raised expectations of widespread use in integrated circuits—both ancillary to electronic circuitry and in all-photonic circuitry. The development of the electrically pumped pn junction laser promised to satisfy the desire. Nevertheless, commercially expedient integrated lasers are not a reality. While there have been a variety of obstacles, $I^2r$ loss coupled with high lasing threshold values are central. For specialized purposes, cooled circuitry might suffice; for general use a more economical approach is needed.

Worldwide effort has addressed the very promising Surface Emitting Laser aka Vertical Cavity Laser, and the consensus is that this approach points the way to commercially feasible OEICs. It is likely prevalent SELs will be based on active regions containing one or more Quantum Wells although active regions based on bulk material are not to be discounted. References tracing introduction and recent development are: Y. Arakawa and A. Yariv, "IEEE J. Quantum Electron.", QE-21, 1666 (1985); Gourley et al, "Applied Physics Letters", 49 (9), 489 (1986) and J. L. Jewell et al, "Optical Engineering", 29, 210-214 (1990).

Effort at this time is directed to an SEL structure consisting of a p-n junction active region in which photons are generated responsive to pumping current—an active region which in earliest work is based on "bulk", likely homogeneous composition, and which, in later work, makes use of Quantum Wells or of superlattice structure. The number of quantum wells, more generally the thickness of the active photon-producing material layer, inescapably dictates lasing threshold. Desired reduction in $I^2r$ heating has led to a decreasing number of QWs, culminating in the 2- or the 1-quantum well structure of U.S. Pat. No. 4,999,842 dated Mar. 12, 1991. Most effective cavitation is due to the very high reflectivity resulting from use of Distributed Bragg Reflectors (with reflectivities well over 99%, e.g. for 20+pair mirror structures on both sides of the active region). See U.S. Pat. No. 4,999,842 describing a structure having a laser emission threshold at 7 microwatts/$\mu m^2$ for DBRs of 24-pair, $\frac{1}{4}$ wavelength ($\frac{1}{4}\lambda$) layers of GaAs and AlAs, embracing an active region based on an 80 Å active layer of $In_{0.2}Ga_{0.8}As$ (1/32 wavelength quantum well) emitting at 980 nm.

While the described work has resulted in acceptable lasing threshold values in the active material itself, heating due to high series resistance in the SEL pump circuit—a circuit including a p-type DBR, the active region, and an n-type DBR—continues to be a problem. Total power efficiency and maximum power obtainable from SELs continues to be low compared to that obtainable from edge-emitting structures (about 5% efficiency and 1 mW power output for SELs vs. 30% and 100 mW) for edge emitting structures. Origin of the problem is largely the p-type DBR—of the high series resistance due to low hole mobility and the high optical absorption resulting from increased p-type doping introduced to reduce resistance. Extensive effort directed to this problem has resulted in optimization of layer-to-layer interfaces in the mirror (allowing Continuous Wave room temperature operation without heat sinks—but only at the indicated performance level). Other effort has taken the form of high p-carrier doping levels either throughout the DBR or at the lowermost level (Y. J. Yang et al, *App. Phys. Letters*, vol. 58, pp. 1780-1782 (April 1991) as well as reduced number of Bragg pairs (by partial, or even complete, substitution of Bragg layers by silver). Both approaches result in associated optical absorption to lower the differential quantum efficiency of the cavity. While the trade-off (of lower resistance for lower quantum efficiency) is a useful design consideration, the overall problem remains unsolved.

SUMMARY OF THE INVENTION

The invention is directed to electrically pumped p-n junction laser structures, exemplified by SELs in which $I^2r$ heating is lessened for given laser output power by removing part or all of one DBR from the electrical pump circuit. Structures of the invention depend upon interpositioning of a layer electrode intermediate the p-type side of the active region and at least the major part of the DBR on that side of the structure. From the operational standpoint, preferred structures depend upon elimination of part or all of the other DBR—desirably of the entirety of both mirrors from the electrical circuit, and rely upon positioning of electrode layers on both sides of the active region—the latter, as described in detail, likely including passive layered material ("primary spacers") of such thickness as to center active (photon-generating) material at the peak of the resulting standing wave (of the standing photonic wave during lasing). In accordance with known practice, reduction of thickness of the active material layer as so placed increases the efficiency with which generated photons contribute to the standing wave while decreasing loss due to absorption of the standing wave energy. Active regions, as made up of three layers—(1) spacer, (2) active material layer, (3) spacer—in an exemplary structure of $\frac{1}{2}\lambda$ thickness. For most purposes, it is useful to regard such active region together with attendant embracing regions—including at least one electrode layer and, likely, a secondary spacer—as together defining a full $\lambda$ cavity. The preferred structure, including another electrode layer and, likely, another associated secondary spacer, is of the same total thickness—like of $\lambda$ thickness. Material included within such cavity may serve additional function—e.g. the secondary spacer may serve to enhance reflectivity, and, accordingly, may be considered part of an adjacent mirror.

A prime operational advantage of SELs of the invention is due to design variations permitted by the basic teaching. In addition to structures in which the advantage is gained by elimination of all or part of the n-type DBR (as well as the prime offender—the p-type DBR), separation of electrical and optical function permits further performance advantage. DBRs, or DBR portions no longer included in the pump circuit, may now be optimized optically. One such modification entails elimination of photon-absorbing, significant impurity dopant from the excluded portion or the entirety of the DBR on the p-type side of the junction—of the (formerly) p-type DBR layers. This electrode layer is contacted laterally (relative to laser emission, which in accordance with usual terminology is described as vertical). In a preferred embodiment, a similar electrode underlies the active region, or, alternatively, a conventional substrate electrode is used, to pump the structure. Such excluded DBRs, perhaps of undoped semiconductor, perhaps of dielectric material are likely of resistivity of $10^{-1}$ ohm-cm or larger.

A primary value of such electrode layers—at least of that replacing p-type DBR layers in the pump circuit—is lessened resistance in the pump circuit. Considerations discussed lead to any of a variety of electrode materials. From the performance standpoint, electrodes are desirably metallic, e.g. gold. This permits least electrode thickness (for prescribed conduction) so as to result in least photonic absorption (for invariant electrode placement as centered on a standing wave node). Fabrication is the primary consideration that may suggest non-metallic electrodes—crystalline lattice matching to allow epitaxial growth, e.g. of secondary spacer and DBR layers, may indicate use of semimetal or heavily doped semiconductor. While advantageous, e.g. in permitting epitaxial growth, such substitution reduces quantum efficiency due to the increase photonic absorption associated with increased electrode thickness. Greater layer-to-layer variation in refractive index permitted by non-epitaxial growth methods, e.g. by magnetron sputtering relieves a restriction on cavity efficiency, Q, to further improve operation. This is a factor in choice of electrode material—non-epitaxial DBR growth may even be advantageous with electrode of semimetal or semiconductor as well as of metal. At this time relatively small index variation in materials suitable for epitaxy lead to non-epitaxial DBR growth techniques for longer wavelength values—$\lambda > 1$ μm as measured in vacuum (e.g. at 1.3 or 1.55 μm).

It is proper to consider the inventive teaching as permitting separation of optical from electrical considerations in the DBR design/fabrication. Accordingly, relaxation of the need for p- or even n-doping of the DBRs adds a degree of freedom. DBR fabrication, for example, by evaporation techniques, is uncomplicated by the need to introduce and control dopant. Now-permitted use of dielectric mirrors reduces absorption: firstly, due to reduced thickness permitted from higher layer-to-layer index variation and, secondly, due to minimization of carrier absorption. Such consideration may, in itself, dictate use of a second electrode layer under the active region to permit use of undoped DBRs, top and bottom.

Improved structures of the invention will have a major effect on a variety of applications such as optical computing, optical interconnection, high speed laser printing, and in visible lasers as in displays. Resulting apparatus, likely based on OEICs containing laser elements described, constitute a significant part of the inventive advance.

GENERAL COMMENTS

It is convenient to describe the inventive teaching in context of SEL structures now receiving worldwide attention. The invention is somewhat broader, in being based on structures in which laser cavitation is of such direction as to have a significant component in the direction of electrical pumping. The observation, that absorption for properly placed electrode layers of thickness less than approximately ¼ wavelength (perhaps as large as 0.3 wavelength) may be a minor concern, is of consequence for any such structure in which cavitating energy is, at least in part, transmitted through the electrode. Structures in which cavitation is designedly non-parallel to the electrical pumping direction may benefit.

Devices are described as containing "pn junctions". In fact, a variety of considerations may lead to an active material layer which is nominally of intrinsic conductivity. The resulting junction may properly be referred to as "pin". Such variation is to be considered as included within general reference to "pn" or "junction", etc.

The invention is not primarily concerned with the exact nature of mirrors based on distributed, cooperative in-phase, reflection due to index change between ¼λ mirror layers. While resulting structures indeed depend upon Bragg reflection, they may differ in detail from conventional DBRs. For example, it is not required that alternating layers be made up of periods of identical index pairs. Pairs may be of differing index to result in graded reflectance, and additional layers, e.g. to result in triplets or higher order periods, may be included.

DETAILED DESCRIPTION

Nomenclature

Description is expedited by definition of terminology used. This is of particular value in view of inconsistent use of many of the terms in the literature.

Active Material Layer—that layer of the SEL primarily responsible for photo generation responsive to pump current.

Active Region—layered portion of the SEL containing the active material layer, generally including sandwiching passage layers (primary spacer layers), as likely bounded by an electrode layer at least on one surface—likely the upper surface, this electrode thereby replacing the transitional p-type DBR in the electrical pump circuit. From the operating standpoint, where there is no lower electrode layer, the active region may usefully be considered as defined by the mirror—usually an n-type DBR on the underside.

Primary Spacer—layer material within the active region embracing the active material layer. Usual design dictates that primary spacer layers are doped with significant impurity, p-type on one side of the active material layer, n-type on the other side of the active material layer, thereby defining or contributing to the pn junction required in contemplated electrically pumped laser structures of the invention. Layered material in addition to the active material layer rand spacer layers within the active region, e.g. serving as part of a DBR, is of conductivity type consistent with the junction—is generally p-type or n-type. For most purposes, additional layered material within the active region is considered as part of the primary spacer.

Electrode Layer—that layer serving for biasing (for pumping) the active region at least on the p-type side of the SEL. Together with an optional paired electrode layer, or, alternatively, together with a conventional electrode layer on the underside of an n-doped DBR, they define the active region.

Secondary Spacer—any passive material, serving little consequential function in terms of either photon generation or mirror function, outside of the active region—generally in contact with an electrode layer. As discussed, a secondary spacer is optional if the primary spacer is of low refractive index relative to relevant DBR layer—desirable if the primary spacer is of relatively high index so as to assure electrode layer positioning so as to correspond with an energy trough in the standing wave.

Conception leading to the disclosure entailed insertion of the p-type electrode into a spacer, so resulting in "secondary" and "primary" spacers. First commercial devices may be of such design, although variation may be with a view to secondary considerations—for example, the secondary spacer may be of altered index to better complement reflectivity of subsequent DBR layers.

Design Criteria

Requirements of the SEL structure of the invention are discussed with reference to FIGS. 1 and 2. Essential features depicted are: active material layer 10, likely constituted of one or more quantum well layers, e.g. as described in U.S. Pat. No. 4,999,842 or, alternatively, of bulk or superlattice material. The improvement in power efficiency offered by the inventive approach increases the likelihood of commercialization of the Single Quantum Well structure of that patent, and it is useful to consider layer 10 as containing a single or small number of quantum wells. In any event, layer 10 is discussed as sandwiched between primary spacer layers 11 and 12. These layers, while shown as constituted of continuous material—which may be of uniform or graded composition may include separately identifiable layers, e.g. layers 11 or 12 may include regions serving as DBR layers, or layer 10 may include regions serving as quantum wells in Multi Quantum Well structures. Compositional grading of layers 11 or 12 may serve to advance secondary design criteria, e.g. reduction of electrical resistance between an electrode and the active material layer. Spacer layers 11 and 12 are doped with significant impurity—e.g. p-type and n-type, respectively. (While structures of the invention may depend upon an upper p-type region for forming the requisite junction, there is no longer a design disadvantage in reversing the junction, particularly for preferred structures in which both DBRs are excluded from the pump circuit.) It is convenient to consider the cavity as including: secondary spacer layer (or DBR layer) 16; electrode layer 14; primary spacer layer 11; active material layer 10; primary spacer layer 12; and if present together with underlying electrode layer 15 and any secondary spacer layer 13. The structure is completed by DBR mirrors 19 and 20. Arrows 21 and 22 represent hole and electron flow resulting in operation. Conductive layers may be of metal, may be of semimetal, or may be semiconductive. Selection depends upon a variety of factors—generally selection based on tradeoff as between performance and ease/cost of fabrication. Energy conservation is favored by use of metal, e.g. gold, silver, titanium, or resistivity perhaps of the order of $10^{-6}$–$10^{-5}$ ohm-cm (in any event offering lower pump circuit $I^2r$ than that of a circuit including the DBR mirror layers now removed from the electrical circuit). Experimental work has led to use of such a metal layer of thickness of perhaps 50–100 Å (or of the order of hundredths of a $\frac{1}{4}$ wavelength). Non-metallic electrode layers—semimetal or semiconductor (the latter containing up to $10^{21}$ carriers/cc) are suitable particularly for shorter wavelength emission—e.g. 0.850 μm. Layer thickness of $\approx 1/12\lambda$ and $\frac{1}{4}\lambda$ for semimetal and semiconductor electrodes, respectively, yield conductance similar to that of metal electrodes. Since conductivity is higher for lower bandgap material, electrode thickness may be increased less than proportionally with longer wavelength for the same conductivity, thereby decreasing the absorption penalty and increasing advantageous use of semiconductor electrodes.

Regions above electrode layer 14 and below spacer 12 (below electrode layer 15, if present), most importantly consist of DBRs 19 and 20 (although secondary spacers 16 and 13 may lie within the DBRs.

Other features shown in the figure represent preferred characteristics but may be omitted for reasons of economy. Such features include encircling thick conductive layer 17 as well as 18 to lessen impedance in the pump circuit.

Figure 1:
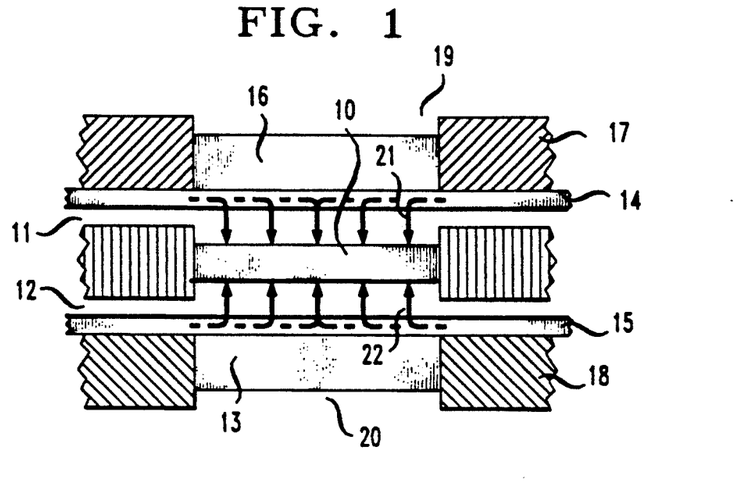
FIG. 1 is a schematic diagram depicting salient features of the relevant portion of an SEL to which reference is made in detailed description of an operating device in accordance with the invention.

FIG. 1 is designed primarily to serve as a basis for the above discussion, and not to exhaustively represent physical configurations. Discussion is largely consistent with an active region 10 supporting a single $\frac{1}{4}$ wavelength standing wave and with a single quantum well placed accordingly—with such well at the center of region 10, thereby assuring placement at the crest of the standing wave. Variations which may serve economic and/or performance goals may entail bulk or superlattice material as well as MQW structures. The inventive advance, importantly, contributes toward increased lasing efficiency, and, so, increases likelihood of commercialization of single quantum well devices (of U.S. Pat. No. 4,999,842). Nevertheless, design flexibility resulting from ability to define layers of tens of Å—with wavelengths of thousands of Å—permits construction of devices with active regions made up of successive quantum wells, or of successive bulk or superlattice material layers centered about successive crests. In general, a preference continues to exist for all active layer material being positioned at a single standing wave crest, so that MQW structures are likely to contain no more than the $\approx 6-7$ QWs which may fit within $\approx \frac{1}{4}$ wavelength about a peak.

As elsewhere in this description, while quantum well structures are certainly preferred from the performance standpoint, other considerations largely pertaining to fabrication cost, may dictate use of bulk or superlattice active material.

Figure 2:
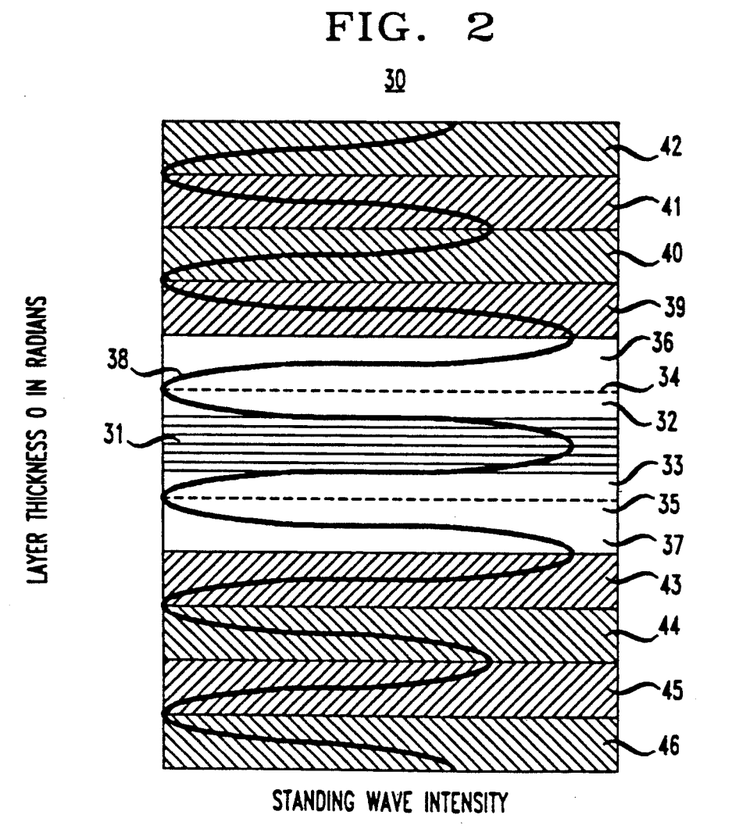
FIG. 2, on coordinates of layer thickness and intensity, depicts a standing wave in an operating SEL on the basis of which a variety of design criteria, including standing wave overlap factors, are discussed.

FIG. 2, a plot on coordinates of layer thickness, $\theta$, on the ordinate and intensity on the abscissa, depicts the standing wave for the center portion of a representative structure, 30. The structure shown consists of an active material layer 31 sandwiched between primary spacer layers 32 and 33. Electrode layers 34 and 35, shown as broken lines, are in contact with the primary spacer layers. Layers 36 and 37 may constitute secondary spacers, or, alternatively, first DBR mirror layers. As discussed, use of secondary spacers serve, inter alia, to assure positional correspondence of electrode layers 34 and 35 with nulls in the standing wave 37—likely as required, e.g. on the p-type side of the structure when the primary spacer, e.g. layer 32 is of high refraction index, n, relative to the first DBR mirror layer. For instances in which the primary spacer is of low index relative to the nearest mirror layer, the secondary spacer may be dispensed with. Under such circumstances, layers 36 and/or 37 may be regarded as mirror layers. Regarding the mirror structures as prototypical DBRs, paired layers above secondary spacer 36 are of low, high, low, high index as corresponding with layers 39–42 in that order. If layer 36 serves as a DBR layer, it is of high index. The underside DBR is symmetrical so that layer 41 is of low index, etc.

The active material layer 31 is of thickness corresponding with $\frac{1}{4}\lambda$, or:

$$\lambda_0/4n \qquad (\text{eq. 1})$$

in which:

$\lambda_0$ is the wavelength as measured in vacuum,
n = refractive index of the active material.

An electrode layer of gold or other highly conductive metal as used experimentally, affords useful conductivity in thickness of the order of 100 Å (perhaps 1/100th of a $\frac{1}{4}$ wavelength as measured in the metal layer). Semimetal or heavily doped semiconductor electrode layer material, still affording sufficient conductivity for thickness below the $\approx \frac{1}{4}\lambda$, the permitted maximum, may serve in a thickness range of perhaps 1/10–1/12$\lambda$, or $\frac{1}{8}$–$\frac{1}{4}\lambda$. (As elsewhere in the description, such measurements are presented as illustrative and not as limiting—actual limits depend upon a number of factors, e.g., the lateral dimensions of the laser.)

The absorption of a thin electrode layer (or of other film) centered on a null is:

$$\alpha\gamma L = \frac{1}{6}\pi^3 L^3 \frac{n^2}{\lambda_0^3}\alpha \qquad (\text{eq. 2})$$

in which:

$\alpha$ = absorption coefficient
$\gamma$ = overlap factor in accordance with eq. 3 or eq. 4
L = film thickness The overlap factor $\gamma$ of a film centered on a peak of the standing wave (centered on an antinode) is:

$$\gamma = 1 + \frac{\sin\theta}{\theta} \approx 2 - \frac{\theta^2}{6} \qquad (\text{eq. 3})$$

in which:

$\theta$ = layer thickness in radians from eq. 5.

The overlap factor of a film centered on a null of the standing wave is:

$$\gamma = 1 - \frac{\sin\theta}{\theta} \approx \frac{\theta^2}{6} \qquad (\text{eq. 4})$$

in which:

$$\theta, \text{ layer thickness in radians, } = \frac{\pi n L}{\lambda_0} \qquad (\text{eq. 5})$$

Absorption as calculated above is for the hypothetical condition of zero reflectivity for the electrode layer. In fact, a metallic electrode layer has significant associated reflectivity to result in increased pass length—likely as corresponding with $\approx$ten reflection incidents—for radiation which is but single pass for the hypothetical condition. Absorption loss increases linearly with pass length. Reflectivity for semimetal and semiconductor electrode layers, while finite, is less than that of contemplated metals.

Figures 3, 3A, 3B:
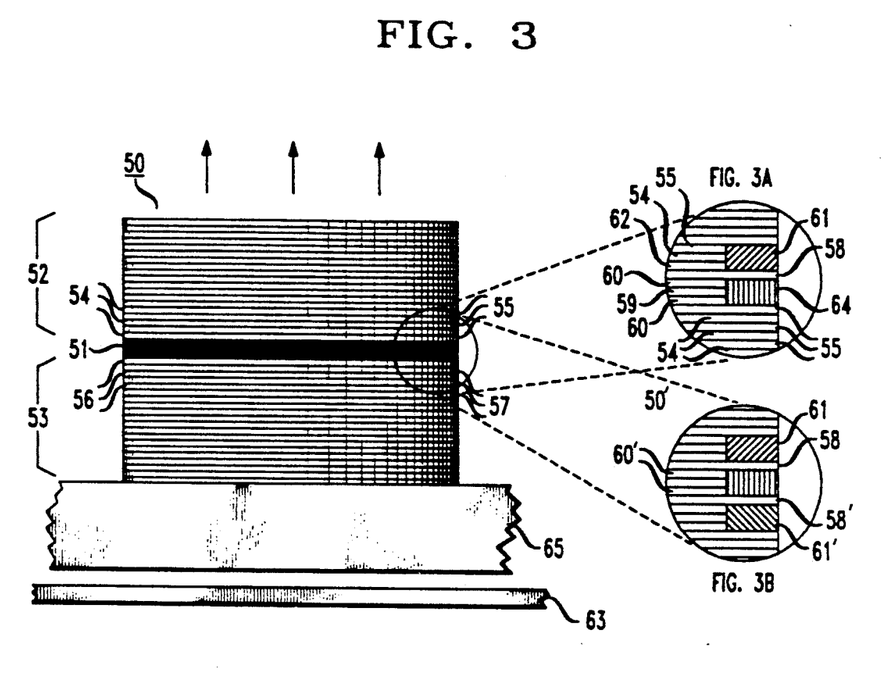
FIG. 3 is a front elevational view of an electrically pumped laser of the invention.

FIG. 3 depicts an SEL structure 50 containing an active region 51 and Bragg mirrors 52 and 53. DBR 52 is constituted of alternating low and high refractive index, $\frac{1}{4}\lambda$, Bragg layers 54 and 55, and mirror 53 is constituted of similar low and high index layers 56 and 57 as discussed in the description of FIG. 2. FIG. 3A illustrates an inventive species in accordance with which the SEL provides for a thin, metallic electrode layer 58 separated from active region 59 by primary spacer 60. For the design shown, desired current flow is assured by relatively thick conductive layer 61 to which feed circuitry, not shown, is connected. Layer region 61 is in conductive contact with and encircles electrode layer 58 which latter is within the functional portion of laser 50. Layer 62 atop electrode layer 58 is the secondary spacer layer, like primary spacer layer 60 of passive material—desirably included as discussed where primary spacer 60 is of low refractive index relative to that of the lowermost mirror layer of DBR 52. It is succeeded by Bragg layers 54 and 55, and may, itself, also serve as a functioning layer of DBR 52. The arrangement shown in FIG. 3A depends upon lower electrode 63, which together with electrode layer 58, and by means of electrical circuitry not shown, electrically pumps the laser. The relative proportions shown are fairly representative of use of a semimetal, a heavily doped semiconductor, or a metal electrode layer 58. The design of FIG. 3A depends upon current blocking region 64 for channeling pump current through encircled active material layer 59. The structure is completed with alternating low and high $\frac{1}{4}$ wavelength layers 56 and 57 on the underside, together constituting DBR 53, and by substrate 65, the latter n-doped where serving as part of the pump circuit including electrode 63. The requisite pn junction within active material layer 59 is the consequence of p-doped spacer 60 and n-doped DBR 53 possibly similar to mirror 52, possibly dissimilar.

FIG. 3B depicts a version of the inventive structure, similar to FIG. 3A dependent upon a second, relatively thin, likely metallic, electrode layer 58' with its encircling thicker conductive layer 61', overlying (likely relatively thick) primary spacer 60'. The design permits elimination of underlying electrode 63 as well as use of an undoped lower DBR mirror 53 possibly similar to mirror 52, possibly dissimilar. The structure of FIG. 3B is otherwise as shown in FIG. 3A.

Figure 4:
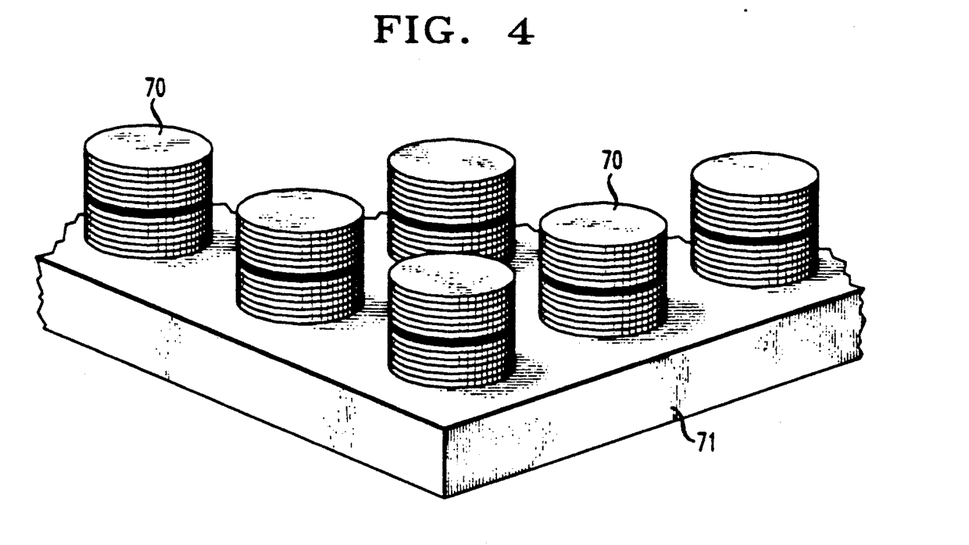
FIG. 4 is a perspective of a portion of an integrated circuit including an array of SELs.

FIG. 4 depicts an array of lasers 70 which may be of the detailed design, e.g. as shown in either of FIGS. 3A or 3B. Supporting substrate 71 may, in the instance of the species of FIG. 3A, have served for epitaxial growth of Bragg mirror 53. Other variations may entail removal of lattice-matched substrate following such epitaxial growth to permit replacement with mechanically preferable material e.g. for more dependable support.

Figure 5:
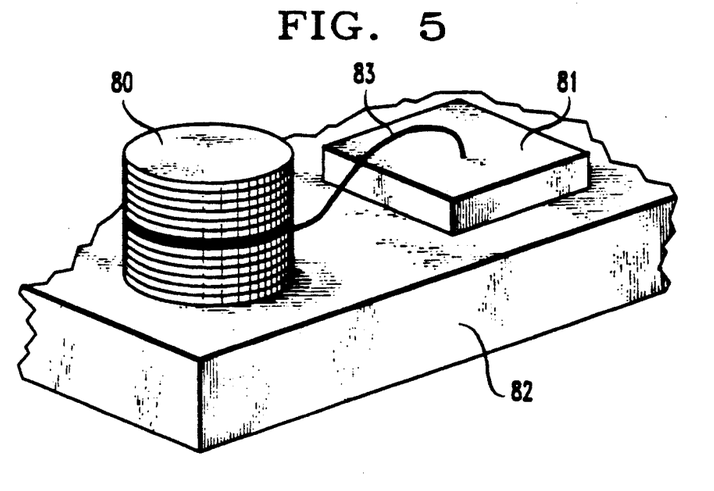
FIG. 5, also in perspective, depicts an integrated circuit containing a laser structure of the invention together with electronic drive circuitry.

FIG. 5 is a schematic representation of a portion of an OEIC consisting of a laser 80, together with drive electronics 81 on common substrate 82. Biasing of structure 80 is by means of lead 83 contacting an upper electrode layer such as layer 58 of either of FIGS. 3A or 3B. A second current path not shown may contact a lower electrode layer, if present, or, alternatively, an underlying electrode such as electrode 58′ of FIG. 3.

Figure 6:
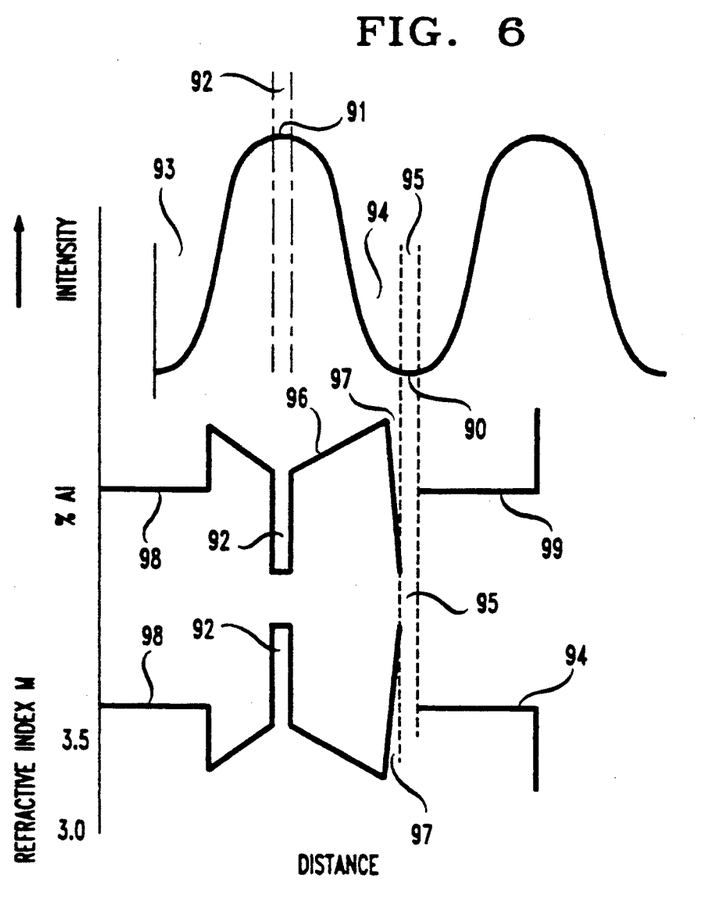
FIG. 6 is a diagram relating an exemplary active region design to the standing wave produced in device operation, all in abscissa units of distance and in ordinate units of dopant composition as well as resulting refractive index descriptive of the region itself and in current density with regard to the standing wave.

FIG. 6 consists of three plots. The first, on coordinates of current on the ordinate and distance on the abscissa, depicts standing wave 89 cycling from trough intensity of minimum current value (null) 90 to maximum current value (or crest) 91. Active material layer 92, in a properly designed structure, is centered at standing wave crest 91. The active region includes primary spacers 93 and 94 sandwiching active material layer 92 to, together, define a $\frac{1}{2}\lambda$ thickness. Electrode layer 95, centered at null 90 completes the structure as represented.

The second plot of FIG. 6, on coordinates of conductivity-compositional variation (in one instance variation of Al content in AlGaAs) on the ordinate and distance on the abscissa represents a structure of composition serving to produce the standing wave of the first plot of FIG. 6. Based on GaAs, in this instance, of Al content ranging from 0% across the active material layer 92 to graded compositions of maximum aluminum content of 40% in the sandwiching primary spacers 93 and 94. Primary spacer 94 achieves a desirable cross-over between loop resistance and photonic absorption by means of increasing aluminum content within region 96 (within the range of from 25–40 at. % for the example shown) and of decreasing aluminum content to a 0% or near-0% aluminum content within region 97, to decrease the conductivity barrier and increase current flow. Mirror layers 98 and 99, in this instance of $\approx 15\%$ Al complete that part of the structure diagrammed.

The third plot of FIG. 6 in ordinate units of refractive index, n, and in the same abscissa units of distance, show the variation in n attendant on the compositional changes shown in the second plot of FIG. 6. Numbering is the same as in the second plot of FIG. 6.

The Table reports characteristics useful in comparison of modified designs (examples numbered 4–9) with the prior art designs (examples 1–3) as treated in the technical literature. It is clear that the inventive advance is usefully incorporated in a large variety of designs, some of which have not yet emerged. It is impractical to describe all such presently contemplated structures, much less to attempt to predict future designs.

Full scope of the invention is defined by the appended claims.

Design parameters heading the columns are those relevant to device design with regard to the thrust of the invention. Column headings are relevant primarily to examples 2 through 9 and are largely inapplicable to the reference, prior art device of example 1. Design parameters in the order of the columns are:

"Material"—material relevant to the pump circuit (with reference to examples 1 through 5, designating doping level of semiconductor material in the p-side electrode layer of the circuit; with reference to examples 6 through 9, designating semimetal or metal composition of the electrode layer). Example 9 provides for a second conducting layer on the n-type side of the SEL as well. Example 1, included for comparison purposes, pertains to a prior art "standard" structure including a 19 period vertically biased p-doped DBR within the pump circuit.

"Thickness" is that of the upper electrode layer for examples 2–9. For example 1, it refers to the penetration depth of cavitating radiation into a GaAs-AlAs DBR. The third column lists values of resistivity of the upper electrode layer in units of micro-ohm-cm.

Absorptivity, $\alpha$, is that of the electrode layer as expressed in units of $cm^{-1}$.

A is the single pass (or per-pass) absorption for cavitating laser radiation for the entire resulting SEL—including both mirrors.

The next two columns report cavity quantum efficiency, $\eta$ also on this basis—first for mirror reflectivity of 99.0%; and in the next column, quantum efficiency on the same basis for mirror reflectivity of 99.8%.

The next column reports values of electrical resistance, r, of the p-type side of the SEL structure—for examples 2–9 as excluding the upper DBR—i.e. of the p-type material and associated electrode layer.

The final column reports the product of r and $A_p$, the single pass absorption of the p-type side of the SEL. This produce is a useful figure of merit in evaluation of advantages realized by structures of the invention.

Other relevant design information is well-known to those skilled in the art and its inclusion here is unnecessary. Such information is available from the literature, see, for example, references cited in "Description of the Prior Art".

| Example | Material | Thickness | $\rho(\mu\Omega cm)$ | $\alpha(cm^{-1})$ | A | $\eta(.990)$ | $\eta(.998)$ | $r(\Omega)$ | $r \cdot A_p$ |
|---|---|---|---|---|---|---|---|---|---|
| 1. | $p(5 \cdot 10^{18})$ | (0.5 $\mu$m) |  | 50 | .0030 | .77 | .40 |  |  |
| 2. | $p(5 \cdot 10^{18})$ | 1 $\mu$m | 10,000 | 50 | .0055 | .65 | .27 | 8 | 0.04 |
| 3. | $p(5 \cdot 10^{18})$ | 3 $\mu$m | 10,000 | 50 | .0155 | .39 | .11 | 2.7 | 0.04 |
| 4. | $p^{++}(10^{20})$ | 550 Å | 1,000 | 500 | .0008 | .91 | .67 | 16 | 0.005 |
| 5. | $p^{++}(10^{21})$ | 300 Å | 300 | 1,500 | .0007 | .93 | .74 | 8 | 0.0016 |
| 6. | ErAs | 200 Å | 50 | 10,000 | .0008 | .93 | .71 | 2 | 0.0006 |
| 7. | W | 50 Å | 11 |  | .0010 | .91 | .67 | 3 | 0.0015 |
| 8. | Au | 50 Å | 5 |  | .0006 | .94 | .77 | 2 | 0.0002 |
| 9. | Au | 50 Å | 5 |  | .0002 | .98 | .91 | 2 | 0.0002 |

Examples 2 through 9 involve lessening of pump circuit due to elimination of the upper, or p-doped, DBR, while final example 9 is directed to a structure in which the lower DBR structure is eliminated as well. Examples 1 through 8 make use of a "conventional" underside electrode—of an n-type contact electrically connected to the underside of the lower n-doped DBR as used in present SEL designs. Discussion is primarily in terms of laser emission at 0.85 $\mu$m. Such discussion is, of course, illustrative only—likely significant commercial use is expected to soon take the form of emission at longer wavelengths, e.g. at 1.3 μm and 1.55 μm. As discussed, the inventive advance is particularly advantageous as practiced at such longer wavelengths.

In all but example 9, the bottom n-type contact, e.g. electrode 63 of FIG. 3, is as used in prior art SEL designs. Example 9, instead, utilizes a second electrode layer on the underside as well. Reported devices as operating at 0.98 μm have utilized upper or p-type Bragg mirrors based on GaAs/AlAs typically conductivity doped to a level of $5 \times 10^{18}$ cm$^{-3}$ and, accordingly, resulting in absorptivity, $\alpha \approx 50$ cm$^{-2}$. Loss for such a standard p-type mirror is, accordingly, approximately 0.0025 (0.25%). This value is comparable to needed levels for acceptably low threshold current densities, and is attainable for SELs of 1-4 quantum well structure. Reduction in external differential quantum efficiency is expressed in terms of mirror reflectivity, R, and absorption loss, A, in accordance with the relationship:

$$\eta = (1-R)/(A+1-R) \qquad \text{(eq. 6)}$$

in which: $\eta$ is laser quantum efficiency (disregarding external pump circuitry) and other terms are as defined above. The simplified equation presented is valid for R values of $\approx 0.9$ and better as qualify the inventive structures.

Examples 2-9 of the Table set forth performance characteristics in which biasing on the top side of the SEL—on the p-type side of the SEL—depends upon transverse conductivity of an electrode layer, e.g. layer 58 of FIG. 3A, with current introduced via the associated thick conductive layer 61—to result in near-uniform current distribution over the p-doped spacer, e.g. layer 60.

The table is described with reference to example numbers: Example 1—use if made of a "standard" p-type mirror as vertically pumped, incurring a loss of 0.0025, which as increased by the constant n-type per-pass absorption of 0.0005 (the experimentally determined value assumed constant for all of examples 1-8) results in the indicated total per-pass absorption, "A" of 0.0030, and in cavity quantum efficiency, "$\eta$" of 0.77 and 0.40, respectively, for 99% and 99.8% mirror reflectances. These values of reflectance, experimentally at 0.98 μm, corresponding with 13 and 17 Bragg periods are appropriate for SELs of about four quantum wells and single quantum well, respectively.

Examples 2-8 are based on use of an electrode layer on the p-type side of the laser while example 9 provides for such layer both on the p- and n-type side. For comparison purposes, all examples may be regarded as based on electrode layers as sandwiched between primary and secondary spacers. For some purposes, presence of the optional "secondary spacer", assuring correspondence of electrode layer position with a null on the standing wave, may be treated as the first DBR layer. Most effective operation is assured by use of such a layer of best optical properties and of refractive index to most effectively advance both objectives.

The Table is, for most purposes, self-explanatory. It relates conductivity, and consequent permitted thickness of the electrode layer to properties determinative of SEL operation. It is seen by comparison of examples 2 through 5, all relating to electrode layers of doped semiconductor, that decreasing resistivity, in permitting decreasing thickness, lessens per-pass absorption to, in turn, result in improved cavity quantum efficiency (ratio of emitted to cavitating radiation). Example 6 is based on an electrode layer of the semimetal, ErAs. Semimetal electrode layers as well as highly doped semiconductor electrode layers, offer a range of crystalline lattice parameters to permit epitaxially growth of subsequent layered material—of secondary spacer as well as DBR layers. Otherwise suitable electrode metals may have lattice parameters to permit epitaxial growth both of the electrode layer and of subsequent material. For example, NiAl as well as CoAl are adequately matched to GaAs. This consideration, primarily concerning fabrication, is of lesser consequence for longer wavelength devices (e.g. 1.3, 1.55 μm) in which non-epitaxial growth techniques offer thinner, more effective DBR structures in any event.

DETAILED DESIGN CONSIDERATIONS

Extensive effort—both experimentation and study—have produced additional design considerations to significantly advance prospective commercial implementation. Results of the effort are reported in this section.

Electrode Layer

Optimal design of the electrode represents a crossover as between the biasing/pump function and device operation. Primary considerations are: electrical, dictating minimal pump circuit resistance and, by itself, leading to thick electrode layers; and optical, particularly optical absorption, leading to thin electrode layers. From the material standpoint, three types of electrode layers are contemplated:

Metal layers are generally desired from the performance standpoint. High conductivities permit thin layers, which are properly located at a null in the standing wave, interact with least photonic energy and permit low per-pass absorption (despite high levels of absorptivity). Gold has been found to be a good choice both for device performance and fabrication. Chemical stability permits considerable freedom in time in fabrication. Other considerations may suggest alternatives—higher melting points of tungsten and titanium may be an advantage—limits diffusion to permit higher fabrication temperature at some expense to performance. Silver, with its lesser absorption for shorter wavelength emission, leads to its consideration e.g. in the visible spectrum.

Tabular examples 7-9 are based on 50 Å layer thickness. While performance suffers somewhat, use of somewhat greater thickness, to 100 Å or higher, e.g. to $\approx 400$ Å may be desirable, e.g. in permitting less fastidious deposition and/or resulting in higher yield.

Semimetal layers, in ongoing work, show improving device performance—approaching that of metal. Reduction in performance penalty for shorter wavelength emission may lead to its preference due to permitted epitaxial growth. Tabular example 6 is based on use of ErAs, which in layer thickness four times that of the metal layers of examples 7-8, results in comparable operating characteristics. For such thicknesses, increased absorption distance for increased thickness for semimetal relative to metal is offset by the decrease in absorptivity resulting from reduced number of carriers. Other semimetals offer a range of lattice parameters to satisfy epitaxial growth for contemplated DBR materials. See T. Sands et al, "Stable and Epitaxial Metal/III-V Semiconductor Heterostructures", *Materials*

*Science Reports*, vol. 5, no. 3 (November 1990). Modification in composition of semimetal electrodes permits adjustment in lattice parameter with little or no effect on conductivity. As an example, scandium has been added to ErAs to to more closely match its lattice parameter to that of GaAs to result in $Sc_xEr_{1-x}As$—e.g. at $X=0.32$, matching is near-exact. From the electrical standpoint, available resistivities generally in the range of from $3 \cdot 10^{-5}$ to $10^{-4}$ ohm-cm suggest layer thicknesses of from 100 Å to 400 Å for contemplated laser structures having symmetrical active regions of approximately $30 \times 30$ μm, or less. Generally, carrier mobilities in semimetals are greater than those in metals, leading to performance-equivalent thinner electrode layers than earlier expected.

Semiconductor materials may be doped sufficiently to serve as a third material variant on the electrode layer. Examples 4 and 5 are based on GaAs, p-doped to levels of the order of $10^{20}$–$10^{21}$ carriers/cm$^3$, e.g. as carbon-doped in accordance with the work of C. R. Abernathy—see, *App. Phys. Let.*, vol. 55, no. 17, pp. 1750-2 (Oct. 23, 1989). Such doping levels have resulted in per-pass absorption again comparable to that of devices using metallic electrode layers (compare example 5 with example 8).

Substrate

For most purposes, substrates are of minimal thickness still assuring high yield of epitaxially grown layers, although some minimal thickness perhaps 250 μm may be desired from a mechanical standpoint. This latter, of course, depends on device, IC, or wafer dimensions, presence or absence of other support, etc. Still other considerations give rise to use of a temporary substrate—e.g. to serve during fabrication/growth—to be removed/replaced with a view to device operation. Removal of GaAs after epitaxial DBR growth, followed by replacement with non-matching material, e.g. diamond or glass, is one example of many, in this instance providing increased transparency, over the $\approx 200$–920 nm range, to permit emission through the underside, usually the n-type side, of the laser structure. For wavelength emission within the range of $\approx 920$–1000 nm, GaAs generally manifests adequate transparency. For still longer wavelength—$\approx 1000$–1655 nm InP is usefully employed.

Aside from growth requirements, device size and other physical requirements are prime determinants for substrate material/design for usual devices providing for top surface emission.

Active Region

Dimensional considerations, primarily of the included active material layer, has been considered (largely in description of FIG. 2). As there indicated, the primary function of photon generation with least absorption loss is optimized by an active material layer of a ¼ wavelength in thickness as measured in the active material (λ/4n), sandwiched between primary spacer layers of relatively little absorption. Total thickness with sandwiching layers is again an integral number of ½ wavelengths—in devices studied such active region is of one wavelength thickness.

Composition choice of the active material is on bases well understood to the skilled artisan. A primary factor concerns emission wavelength. Categories of suitable materials extensively studied at this time are based on modified GaAs for longer wavelengths within the visible and near-visible spectra, and on modified InP for longer wavelengths extending further into the infrared spectrum. Exemplary active materials, suitably grown by epitaxy on substrates of such binary compositions, of intermediate ternaries, as well as on alternative compositions are known from a variety of references, for example, from above cited U.S. Pat. No. 4,999,842. Such references report a number of active materials operated either as bulk or as quantum wells. For convenience, representative compositions are tabulated in terms of associated emission wavelength ("QW" following the active composition identifies materials operated as quantum wells rather than bulk):

| Active Material | λ(nm) |
|---|---|
| InGaAlP QW | 630–650 |
| InGaAlP | 660–670 |
| InGaP QW | 655–700 |
| InGaP | 670 |
| AlGaAs | 700–800 |
| GaAs QW | 800–860 |
| GaAs | 880 |
| InGaAs QW | 880–1100 |
| InGaAsP | 950–1400 |
| InGaAs QW | 1400–1600 |
| InGaAs | 1655 |

The active region, generally defined by bridging mirror structures (generally DBRs), or by electrode layer/s as present, also includes the primary spacers. Requirements placed on such spacer material are: from the performance standpoint, minimal absorption for cavitating laser radiation; from the fabrication standpoint, crystalline lattice parameters to permit epitaxial growth both of the spacer and of subsequent material (of the active material layer and/or secondary spacer or DBR layer). From the dimensional standpoint, thickness is such as to result in the required ½λ or integral number thereof (as allowing for any penetration, e.g. in adjacent DBR layers).

Primary spacers, since within the electrical pump circuit, are doped p- or n-type as part of the functioning pn junction laser. Structures considered have sometimes been based on graded doping/conductivity with conductivity increasing to reach a maximum where in contact with an electrode layer. Such graded composition reduces electrical resistance at the spacer-electrode interface.

Cavity Mirrors, likely DBRs, perhaps as including conventional reflectors to result in "hybrid" mirrors, (see U.S. Pat. No. 4,991,179, issued Feb. 5, 1991) are well-known. Alternating layers of AlAs and $Al_x Ga_{1-x}As$, resulting in index change of $\approx 3.0$–3.5, have been used for emission wavelengths below about 1 μm (as measured in vacuum). As noted, epitaxial growth techniques are appropriate. For longer wavelength emission, e.g. at 1.3, 1.55 μm, reported materials are of substantially lesser index change so that overall advantage makes use of non-epitaxial growth (e.g. of magnetron sputtering deposition) importantly of alternating layers of Si and $SiO_2$ with index differences of $\approx 3.5$–1.5—to permit the desired 99+% reflectivity for structures of perhaps 4 mirror periods.

Reflectivity of a DBR interface is proportional to the quantity $$\left[\frac{n_2 - n_1}{n_2 + n_1}\right]^2 \quad \text{(eq. 7)}$$

in which:
n₁ = refractive index of DBR layer of lesser index
n₂ = refractive index of DBR layer of greater index Study leads to devices which yield cavity reflectivity of >99.9% for 28 period DBRs of AlAs and 15% AlGaAs (Al$_{0.15}$Ga$_{0.85}$As) for emission at 0.85 μm. Four period DBRs of Si and SiO$_2$ yielded such reflectivity at 1.3 μm.

General Comment—Expected impact of the inventive teaching has resulted in extensive consideration/experimentation to result in a level of development of considerable sophistication. In a desire to meet the patent laws and to successfully survive subsequent court attack, every effort for full disclosure has been made. The very profundity of the teaching has complicated disclosure. Many aspects of the claimed invention at its present stage of development—in providing for contemplated problems, in optimizing operation terms of real conditions—represent complications to increase difficulty in description of the general advance. As an example, in-principle discussion of cavitation and related properties of e.g. λ is complicated by secondary design considerations resulting from penetration of cavitating energy and multiple reflections within an electrode layer to result in an increase in optical length of the cavity. Experimentation and consideration have advanced to a level at which it is improper even to provide for cavity dimensions as so corrected. Designs which may gain in operation from electrode cross-sections of deliberately graded conductivity, deny even this non-simplifying assumption. This consideration is further complicated by difference in behavior based on electrode design as affecting interfacial reflectivity, absorptivity, and thickness.

For the most part, terminology definition and discussion have been in terms of device design appropriate to and likely to be adopted for textbook description. In terms of the above example, the active region is initially described as uncomplicated by the electrode layer, while, in truth, correction must be made for its presence. The description has been in this general format—with initial discussion in terms of the hypothetical structure as initially disregarding such sophisticated, sometimes secondary, variations. Only in subsequent description has attention been paid to such matters. In similar manner, claim language is to some extent necessarily in terms of such hypothetical structure. The person skilled in the art will, upon reading this description, be fully understanding of the teaching and will be enabled to carry out the inventive teaching without undue experimentation as required by the patent laws.

We claim:

1. Apparatus comprising at least one electrically pumped vertical cavity laser consisting essentially of an active region containing a semiconductor active material layer for generating photons to result in laser emission, said active region comprising p-type and n-type conductivity portions and including a semiconductor junction, said active region being sandwiched between Distributed Bragg Reflectors each comprising a plurality of layers of relatively low and high refractive index for the said laser emission, together with circuit means for electrically pumping said active region to lasing threshold, lasing entailing presence of a standing wave defining a cavity here described as including the said electrode and as bounded by a cavity between the said Distributed Bragg Reflectors characterized in that said circuit means includes an electrode layer at least part of which is outside said active region, whereby at least a major portion of one DBR is excluded from the circuit means, said electrode layer having a conductivity sufficient to result in total conduction of said circuit greater than that of a circuit including the entire DBR as conductivity-doped to an average carrier concentration of 10$^{19}$ carriers/cm$^3$, and in that absorption for laser emission is reduced in part due to reduction in conductivity-doping of the excluded portion of the DBR to result in a numerical value of equal to or less than 0.25 for the product r·A$_p$ in which r is circuit resistance in ohms of that portion of the circuit consisting of p-type material and the associated electrode layer and A$_p$ is per-pass photon absorption for that circuit portion expressed as a fraction.

2. Apparatus of claim 1 in which the thickness of said electrode layer is less than about ¼ wavelength for the laser emission as measured within the electrode in the direction defined by the standing wave.

3. Apparatus of claim 2 in which said active region consists essentially of said active material layer together with sandwiching primary spacer layers.

4. Apparatus of claim 3 in which said active material layer is of a maximum of approximately centered on a crest of the standing wave and the thickness of said active material layer is less than ½ wavelength of the standing layer.

5. Apparatus of claim 5 in which the thickness of said active material layer is of a maximum approximately ¼ wavelength of the standing wave, in which said electrode layer is positioned to correspond with a null in the standing wave.

6. Apparatus of claim 5 in which said primary spacer layers doped with significant impurity resulting in the first such layer being of p-type conductivity and the second such layer being of n-type conductivity, in which said excluded DBR portion is on the p-type side of said active region and in which such excluded portion is of resistivity of a minimum of 10$^{-1}$ ohm-cm.

7. Apparatus of claim 6 in which the active material layer is at least in part of substantially intrinsic conductivity.

8. Apparatus of claim 6 in which substantially the entirety of said DBR is on the other side of said electrode layer from said active region so that substantially the entirety is excluded from the circuit means.

9. Apparatus of claim 8 in which said electrode layer is metallic and of thickness of a maximum of approximately 400 Å.

10. Apparatus of claim 9 in which said electrode layer comprises at least one element selected from the group consisting of gold, tungsten, molybdenum, copper, titanium, silver, NaAl and CoAl and the electrode layer is of thickness of a maximum of approximately 100 Å.

11. Apparatus of claim 10 in which said electrode layer consists essentially of gold.

12. Apparatus of claim 8 in which said electrode layer consists essentially of semimetal.

13. Apparatus of claim 12 in which the resistivity of at least a substantial portion of said electrode layer is within the approximate range of from $3 \cdot 10^{-5} - 10^{-4}$ ohm-cm and is of thickness within the approximate range of 100 Å–400 Å.

14. Apparatus of claim 13 in which said electrode layer is comprised of ErAs.

15. Apparatus of claim 14 in which said electrode layer consists essentially of $Sc_xEr_{1-x}As$.

16. Apparatus of claim 8 in which said electrode layer consists essentially of semiconductor which is doped with significant impurity to result in an electrical carrier density of at least about $10^{20}/cm^3$.

17. Apparatus of claims 10, 12 and 16 in which the DBR on the p-type side is epitaxially grown.

18. Apparatus of claim 1 in which said circuit means provides for pump current which is substantially parallel in direction with the standing wave within said active region and in which laser emission is through the surface of the excluded DBR layer furthest removed from the active region.

19. Apparatus of claim 8 in which said circuit means includes a second electrode layer intermediate the active region and the second DBR whereby the second DBR is also excluded from the circuit means.

20. Apparatus of claim 19 in which the second DBR is of resistivity of a minimum of $10^{-1}$ ohm-cm.

21. Apparatus of claim 1 in which the laser is supported on a substrate and in which laser emission is through the substrate.

22. Apparatus of claim 1 comprising an integrated circuit including a plurality of such lasers.

23. Apparatus of claim 22 in which the integrated circuit is an Opto Electronic Integrated Circuit including electronic elements in the circuit means.

* * * * *